(12) United States Patent
Shibata et al.

(10) Patent No.: US 8,405,126 B2
(45) Date of Patent: Mar. 26, 2013

(54) SEMICONDUCTOR DEVICE

(75) Inventors: Daisuke Shibata, Kyoto (JP); Tatsuo Morita, Kyoto (JP); Manabu Yanagihara, Osaka (JP); Yasuhiro Uemoto, Toyama (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 13/196,512

(22) Filed: Aug. 2, 2011

(65) Prior Publication Data

US 2011/0284928 A1    Nov. 24, 2011

Related U.S. Application Data

(63) Continuation of application No. PCT/JP2009/005828, filed on Nov. 2, 2009.

(30) Foreign Application Priority Data

Feb. 13, 2009  (JP) ................................ 2009-031099

(51) Int. Cl.
*H01L 29/778* (2006.01)
(52) U.S. Cl. . 257/195; 257/194; 257/192; 257/E29.246; 257/E27.016; 438/285; 438/590; 438/936
(58) Field of Classification Search .................. 257/195, 257/194, 192, 196, E29.246, E27.016; 438/285, 438/590, 936
See application file for complete search history.

(56) References Cited

U.S. PATENT DOCUMENTS

| | | | |
|---|---|---|---|
| 6,255,679 B1 | 7/2001 | Akiba | |
| 6,281,528 B1 * | 8/2001 | Wada | ............................ 257/200 |
| 7,576,373 B1 | 8/2009 | Hikita et al. | |
| 2005/0051793 A1 | 3/2005 | Ishida et al. | |
| 2005/0263822 A1 | 12/2005 | Asano | |
| 2006/0273347 A1 | 12/2006 | Hikita et al. | |
| 2006/0273396 A1 | 12/2006 | Anda et al. | |

FOREIGN PATENT DOCUMENTS

| | | |
|---|---|---|
| JP | 02-215224 | 8/1990 |
| JP | 11-045891 | 2/1999 |
| JP | 2000-022089 | 1/2000 |
| JP | 2005-101565 | 4/2005 |
| JP | 2005-203514 | 7/2005 |
| JP | 2005-340549 | 12/2005 |
| JP | 2006-339561 | 12/2006 |
| JP | 2006-339606 | 12/2006 |
| JP | 2007-220895 | 8/2007 |
| JP | 2007-281551 | 10/2007 |

OTHER PUBLICATIONS

Saito, W., et al., "High Breakdown Voltage AlGaN-GaN Power-HEMT Design and High Current Density Switching Behavior", IEEE Transactions on Electron Devices, Dec. 2003, pp. 2528-2531, vol. 50, No. 12, IEEE.

\* cited by examiner

*Primary Examiner* — Thinh T Nguyen
(74) *Attorney, Agent, or Firm* — McDermott Will & Emery LLP (57) ABSTRACT

A semiconductor device includes a semiconductor layer stack formed on a substrate, a first ohmic electrode and a second ohmic electrode which are formed on the semiconductor layer stack, and are spaced from each other, a first control layer formed between the first ohmic electrode and the second ohmic electrode, and a first gate electrode formed on the first control layer. The first control layer includes a lower layer, an intermediate layer which is formed on the lower layer, and has lower impurity concentration than the lower layer, and an upper layer which is formed on the intermediate layer, and has higher impurity concentration than the intermediate layer.

5 Claims, 7 Drawing Sheets

FIG.13

SEMICONDUCTOR DEVICE

CROSS-REFERENCE TO RELATED APPLICATION

This is a continuation of PCT International Application PCT/JP2009/005828 filed on Nov. 2, 2009, which claims priority to Japanese Patent Application No. 2009-031099 filed on Feb. 13, 2009. The disclosures of these applications including the specifications, the drawings, and the claims are hereby incorporated by reference in their entirety.

BACKGROUND

The present disclosure relates to semiconductor devices, particularly to nitride semiconductor devices which can be used as power transistors etc.

Nitride semiconductors represented by gallium nitride (GaN) are wide gap semiconductors. For example, GaN and AlN have band gaps as large as of 3.4 eV and 6.2 eV, respectively, at room temperature. The nitride semiconductors have high breakdown field strength, and high saturated drift velocity of electrons as compared with compound semiconductors such as gallium arsenide (GaAs) etc., or silicon (Si) semiconductors, etc. In a heterostructure of AlGaN and GaN on plane (0001), charges are generated at a heterointerface due to spontaneous polarization and piezoelectric polarization. The charges generated at the heterointerface between AlGaN and GaN have a sheet carrier concentration of $1 \times 10^{13}$ cm$^{-2}$ or higher even when AlGaN and GaN are undoped. A heterojunction field effect transistor (HFET) having high current density, and low on-resistance can be provided by using two-dimensional electron gas (2DEG) generated at the heterointerface (see, for example, 1W. Saito et al., IEEE Transactions on Electron Devices, 2003, vol. 50, No. 12, p. 2528).

In a HFET using a heterostructure of AlGaN and GaN, characteristics of a FET can be improved by providing a p-type nitride semiconductor layer below a gate electrode (see, for example, Japanese Patent Publication No. 2006-339561). With the p-type layer provided below the gate electrode, pn junction is formed between the 2DEG, which is generated at an interface between the AlGaN layer and the GaN layer, and the p-type layer. Thus, gate leakage current is less likely to flow even when gate voltage is increased, and large drain current can be obtained. Further, a normally-off HFET can be provided.

SUMMARY

When the HFET using the nitride semiconductor is used as a switching device, ringing of drain current may occur upon switching, or high surge voltage may be generated upon turning an inductive load off. When the ringing occurs, or the surge voltage is generated, switching loss may increase, or the switching device may break. The occurrence of the ringing and the surge voltage can be reduced by connecting resistance to the gate in series. However, the resistance has to be externally connected to the gate. This increases the number of external parts, and increases an area and cost of the switching device.

The present disclosure is intended to provide a semiconductor device having high switching performance without increasing the number of external parts, and an area and cost of the semiconductor device.

To accomplish the intention, an example semiconductor device includes a resistive element inserted in a gate electrode.

Specifically, a first semiconductor device includes: a substrate; a semiconductor layer stack including a first nitride semiconductor layer which is formed on the substrate, and a second nitride semiconductor layer which is formed on the first nitride semiconductor layer, and has larger band gap than the first nitride semiconductor layer; a first ohmic electrode and a second ohmic electrode which are formed on the semiconductor layer stack, and are spaced from each other; a first control layer formed between the first ohmic electrode and the second ohmic electrode; and a first gate electrode formed on the first control layer, wherein the first control layer is formed with a p-type nitride semiconductor layer stack, and the p-type nitride semiconductor layer stack includes a lower layer which is in contact with the second nitride semiconductor layer, an intermediate layer which is formed on the lower layer, and has lower impurity concentration than the lower layer, and an upper layer which is formed on the intermediate layer, and has higher impurity concentration than the intermediate layer.

In the first semiconductor device, the control layer formed below the gate electrode has a layer having low impurity concentration and high resistance. Thus, resistance of the gate electrode increases, which is as advantageous as providing a resistive element externally connected to the gate electrode. This can provide the semiconductor device with high switching performance without increasing the number of external parts, and an area and cost of the semiconductor device.

In the first semiconductor device, the intermediate layer may be thicker than the lower layer.

In the first semiconductor device, the lower layer may be thicker than the upper layer.

In the first semiconductor device, the number of carriers per unit area in the lower layer may be equal to or greater than the number of electrons per unit area in two-dimensional electron gas generated at an interface between the first nitride semiconductor layer and the second nitride semiconductor layer.

The first semiconductor device may further include: a second control layer which is formed between the first control layer and the second ohmic electrode, and is formed with the p-type nitride semiconductor layer stack; and a second gate electrode formed on the second control layer.

A second semiconductor device includes: a substrate; a semiconductor layer stack including a first nitride semiconductor layer which is formed on the substrate, and a second nitride semiconductor layer which is formed on the first nitride semiconductor layer, and has larger band gap than the first nitride semiconductor layer; a first ohmic electrode and a second ohmic electrode which are formed on the semiconductor layer stack, and are spaced from each other; a first gate electrode formed between the first ohmic electrode and the second ohmic electrode with a first control layer which is formed with a p-type third nitride semiconductor layer interposed between the first gate electrode and the semiconductor layer stack; a first gate pad formed on the semiconductor layer stack; a first gate interconnect which is formed on the semiconductor layer stack, and connects the first gate electrode and the first gate pad; and a first resistive element which is formed in the semiconductor layer stack, and is inserted in the first gate interconnect.

The second semiconductor device includes the first resistive element which is formed in the semiconductor layer stack, and is inserted in the first gate interconnect. Thus, a circuit including the gate electrode and resistance which are connected in series can be provided without providing externally connected resistance. This can provide the semiconductor device with high switching performance without increasing the number of external parts, and an area and cost of the semiconductor device.

In the second semiconductor device, the semiconductor layer stack may include an active region, and a dielectric isolation region having higher resistance than the active region, and the first resistive element may be a p-type fourth nitride semiconductor layer formed on the dielectric isolation region.

In the second semiconductor device, the semiconductor layer stack may include an active region, and a dielectric isolation region having higher resistance than the active region, and the first resistive element may be a metal layer which is formed on the dielectric isolation region, and has higher specific resistance than the first gate interconnect.

In the second semiconductor device, the first resistive element may include a two-dimensional electron gas layer which is formed at an interface between the first nitride semiconductor layer and the second nitride semiconductor layer, and metal terminals which are formed to be spaced from each other, and each of which forms ohmic contact with the two-dimensional electron gas layer.

In the second semiconductor device, the first ohmic electrode may include a plurality of first ohmic electrode fingers, the second ohmic electrode may include a plurality of second ohmic electrode fingers, the first gate electrode may include a plurality of first gate electrode fingers, the first gate interconnect may include a finger connector which connects the plurality of first gate electrode fingers in parallel, and the first resistive element may be connected between the finger connector and the first gate pad.

In the second semiconductor device, the first ohmic electrode may include a plurality of first ohmic electrode fingers, the second ohmic electrode may include a plurality of second ohmic electrode fingers, the first gate electrode may include a plurality of first gate electrode fingers, and multiple ones of the first resistive element may be provided, each of which may be connected between each of the first gate electrode fingers and the first gate interconnect.

The second semiconductor device may further include: a second gate electrode which is formed between the first gate electrode and the second ohmic electrode with a second control layer interposed between the second gate electrode and the semiconductor layer stack; a second gate pad formed on the semiconductor layer stack; a second gate interconnect which is formed on the semiconductor layer stack, and connects the second gate electrode and the second gate pad; and a second resistive element which is formed in the semiconductor layer stack, and is inserted in the second gate interconnect.

A third semiconductor device includes: a substrate; a semiconductor layer stack including a first nitride semiconductor layer which is formed on the substrate, and a second nitride semiconductor layer which is formed on the first nitride semiconductor layer, and has larger band gap than the first nitride semiconductor layer; a first ohmic electrode and a second ohmic electrode which are formed on the semiconductor layer stack, and are spaced from each other; a first gate electrode formed between the first ohmic electrode and the second ohmic electrode with a first control layer which is formed with a p-type third nitride semiconductor layer interposed between the first gate electrode and the semiconductor layer stack; a first gate pad formed on the semiconductor layer stack; a first gate interconnect which is formed on the semiconductor layer stack, and connects the first gate electrode and the first gate pad; and a first diode which is formed in the semiconductor layer stack, and is inserted in the first gate interconnect.

The third semiconductor device includes the first diode which is formed in the semiconductor layer stack, and is inserted in the first gate interconnect. Thus, a resistance value of the gate electrode can be increased without providing externally connected resistance. Further, a threshold of the semiconductor device can be increased by forward threshold voltage of the diode, thereby improving noise immunity.

In the third semiconductor device, the first diode may include pn junction formed by a p-type fourth nitride semiconductor layer, and a two-dimensional electron gas layer which is formed at an interface between the first nitride semiconductor layer and the second nitride semiconductor layer, and a cathode electrode which forms ohmic contact with the two-dimensional electron gas layer.

In the third semiconductor device, the first diode may include an anode electrode which forms Schottky contact with a two-dimensional electron gas layer which is formed at an interface between the first nitride semiconductor layer and the second nitride semiconductor layer, and a cathode electrode which forms ohmic contact with the two-dimensional electron gas layer.

In the third semiconductor device, the first ohmic electrode may include a plurality of first ohmic electrode fingers, the second ohmic electrode may include a plurality of second ohmic electrode fingers, the first gate electrode may include a plurality of first gate electrode fingers, the first gate interconnect may include a finger connector which connects the plurality of first gate electrode fingers in parallel, and the first diode may be connected between the finger connector and the first gate pad.

In the third semiconductor device, the first ohmic electrode may include a plurality of first ohmic electrode fingers, the second ohmic electrode may include a plurality of second ohmic electrode fingers, the first gate electrode may include a plurality of first gate electrode fingers, and multiple ones of the first diode are provided, each of which is connected between each of the first gate electrode fingers and the first gate interconnect.

The third semiconductor device may further include: a second gate electrode which is formed between the first gate electrode and the second ohmic electrode with a second control layer interposed between the second gate electrode and the semiconductor layer stack; a second gate pad formed on the semiconductor layer stack; a second gate interconnect which is formed on the semiconductor layer stack, and connects the second gate electrode and the second gate pad; and a second diode which is formed in the semiconductor layer stack, and is inserted in the second gate interconnect.

According to the present disclosure, the semiconductor device can be provided with high switching performance without increasing the number of external parts, and an area and cost of the semiconductor device.

DETAILED DESCRIPTION

In the present disclosure, AlGaN designates a ternary compound $Al_xGa_{1-x}N$ (where $0 \leq x \leq 1$). Compounds are abbreviated as, for example, AlInN, GaInN, etc., which are symbols of elements constituting the crystal. For example, nitride semiconductor $Al_xGa_{1-x-y}In_yN$ (where $0 \leq x \leq 1$, $0 \leq y \leq 1$, $x+y \leq 1$) is abbreviated as AlGaInN.

The term "undoped" means that impurities are not intentionally introduced. The symbol "p+" indicates that high concentration p-type carriers are contained, and the symbol "p−" indicates that low concentration p-type carriers are contained.

First Embodiment

Figure 1:
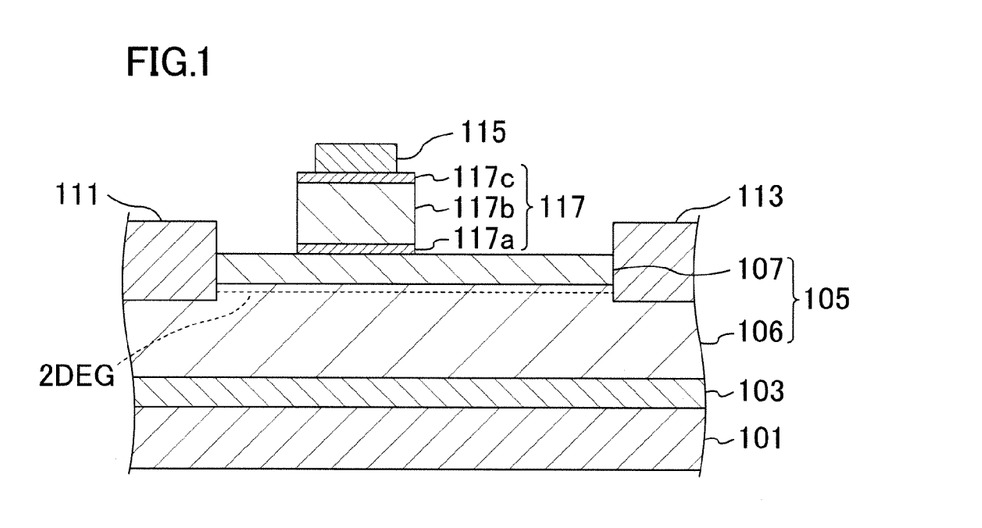
FIG. 1 is a cross-sectional view illustrating a semiconductor device of a first embodiment.

A first embodiment will be described with reference to the drawings. FIG. 1 is a cross-sectional view illustrating a semiconductor device of the first embodiment. As shown in FIG. 1, the semiconductor device of the present embodiment is a HFET formed on a substrate 101. The substrate 101 may be made of Si, sapphire, silicon carbide (SiC), GaN, etc. A 2 μm thick buffer layer 103 is formed on the substrate 101. On the buffer layer 103, a 3 μm thick first nitride semiconductor layer 106 made of undoped GaN, and a 25 nm thick second nitride semiconductor layer 107 made of undoped AlGaN are sequentially stacked to constitute a semiconductor layer stack 105.

A first ohmic electrode 111 as a source electrode, and a second ohmic electrode 113 as a drain electrode are formed on the semiconductor layer stack 105. The first ohmic electrode 111 and the second ohmic electrode 113 may be made of any material as long as they can form ohmic contact with a two-dimensional electron gas layer (a 2DEG layer) formed near an interface between the first nitride semiconductor layer 106 and the second nitride semiconductor layer 107. For example, the ohmic electrodes may be formed with a stack of titanium (Ti) and aluminum (Al). The ohmic electrodes may be made of other materials. To reduce contact resistance, the electrodes are formed to fill recesses exposing the 2DEG layer. However, the electrodes may be formed on the second nitride semiconductor layer without forming the recesses.

A gate electrode 115 is formed on the second nitride semiconductor layer 107 between the first ohmic electrode 111 and the second ohmic electrode 113 with a control layer 117 formed with a p-type nitride semiconductor layer stack interposed between the gate electrode and the second nitride semiconductor layer. The control layer 117 includes a 100 nm thick lower layer 117a made of p+-AlGaN, a 800 nm thick intermediate layer 117b made of p−-AlGaN, and a 5 nm thick upper layer 117c made of p+-AlGaN. The gate electrode 115 may be made of any material as long as it can form ohmic contact with the p+-AlGaN upper layer 117c, and may be made of palladium (Pd), nickel (Ni), etc.

Figure 2:
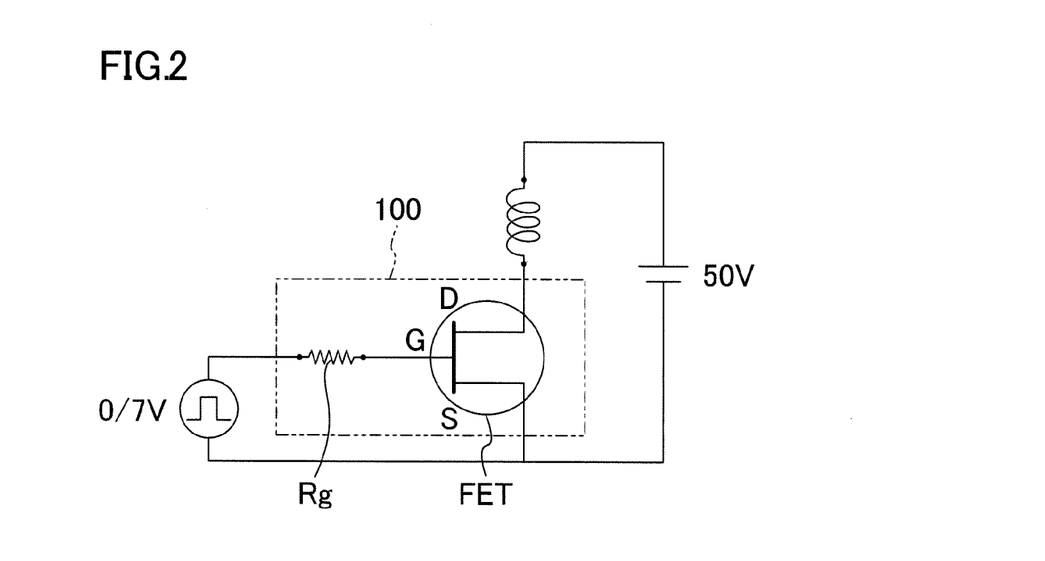
FIG. 2 is a circuit diagram equivalent to the semiconductor device of the first embodiment.
Figure 3:
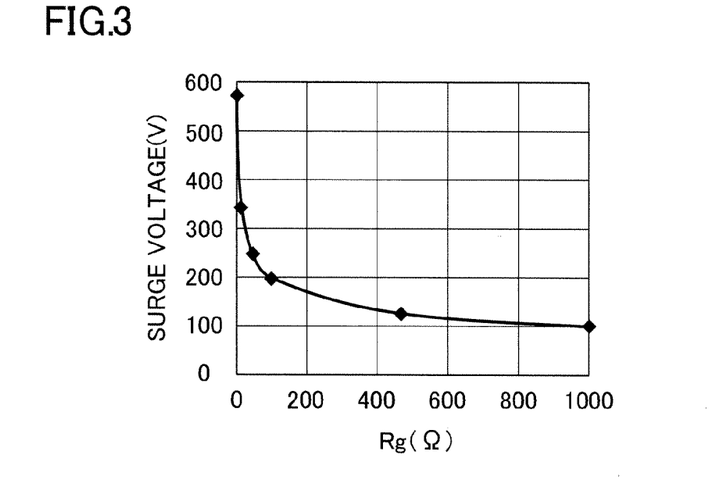
FIG. 3 is a graph illustrating relationship between resistance connected to a gate and surge voltage.

In the semiconductor device of the present embodiment, the intermediate layer 117b of the control layer 117 is the p−-AlGaN layer having low impurity concentration and high resistance. This structure is equivalent to a circuit in which resistance is series-connected to the gate electrode 115. Accordingly, the semiconductor device of the present embodiment can be regarded as, for example, a semiconductor device 100 shown in FIG. 2 which integrally includes a FET, and resistance Rg which is series-connected to a gate of the FET. When the resistance Rg increases, surge voltage generated upon turning an inductive load off can be reduced as shown in FIG. 3. Thus, the semiconductor device can be provided with a good switching characteristic by adjusting the impurity concentration and thickness of the intermediate layer 117b, without externally connecting resistance to the semiconductor device. The thickness and carrier concentration of the intermediate layer 117b can be determined based on required characteristics. When the control layer 117 is made of $Al_{0.25}Ga_{0.75}N$, the thickness and the carrier concentration of the intermediate layer 117b may be adjusted to 400 nm-1000 nm, and $1 \times 10^{15}$ cm$^{-3}$ or lower, respectively.

When the impurity concentration is reduced throughout the control layer 117, electrons in the 2DEG layer cannot be canceled, and the HFET cannot be normally-off. However, the control layer 117 of the present embodiment includes the lower layer 117a having high impurity concentration. When the first nitride semiconductor layer 106 is the undoped GaN layer, and the second nitride semiconductor layer is the 25 nm thick undoped $Al_{0.25}Ga_{0.75}N$ layer, an electron concentration of the 2DEG layer is about $1 \times 10^{13}$ cm$^{-2}$. Thus, for example, when the lower layer 117a has a thickness of 100 nm, and a carrier concentration of $1 \times 10^{18}$ cm$^{-3}$ or higher, the number of carriers in the lower layer 117a per unit area is greater than the number of electrons in the 2DEG layer per unit area. Thus, the electrons of the 2DEG layer can be canceled by the carriers in the lower layer 117a, and the HFET can be normally-off. The thickness and the carrier concentration of the lower layer 117a can be determined based on required characteristics. For example, the thickness may be 50 nm or higher, and the carrier concentration may be $1 \times 10^{18}$ cm$^{-3}$ or higher. The thickness and the carrier concentration of the lower layer 117a may be determined in view of the thickness and the Al composition of the second nitride semiconductor layer 107.

When the gate electrode 115 is directly formed on the intermediate layer 117b having low carrier concentration, the ohmic contact cannot be easily formed, and reliability of the semiconductor device may decrease. In the present embodiment, the upper layer 117c having high carrier concentration is formed to facilitate the formation of the ohmic contact between the gate electrode 115 and the control layer 117. The thickness and the carrier concentration of the upper layer 117c can suitably be determined as required. For example, the thickness may be 2 nm-40 nm, and the carrier concentration may be $1 \times 10^{18}$ cm$^{3}$ or higher, respectively.

Figure 4:
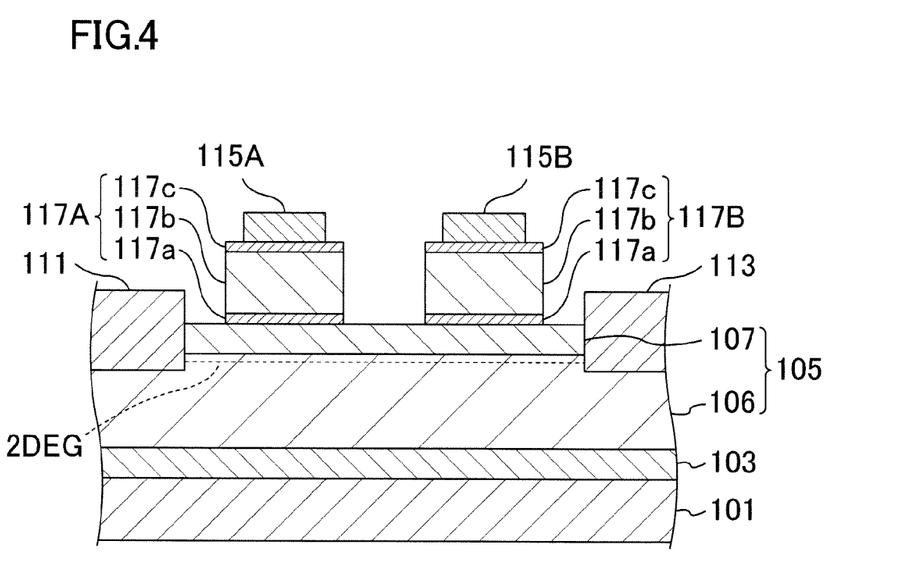
FIG. 4 is a cross-sectional view illustrating an alternative of the semiconductor device of the first embodiment.

In the above paragraphs, the structure of a single gate HFET has been described. However, a double gate HFET used for bidirectional switches etc. may be configured in the same manner to improve the switching characteristic. In this case, as shown in FIG. 4, a first control layer 117A and a second control layer 117B may be provided between the first ohmic electrode 111 and the second ohmic electrode 113 to form a first gate electrode 115A and a second gate electrode 115B on the first control layer 117A and the second control layer 117B, respectively. The first control layer 117A and the second control layer 117B may be configured in the same manner as the control layer 117 shown in FIG. 1. The first control layer 117A and the second control layer 117B may preferably have the same structure because the first and second gate electrodes are balanced. However, the first control layer 117A and the second control layer 117B may have different structures so that the first and second gate electrodes have different characteristics.

Second Embodiment

Figure 5:
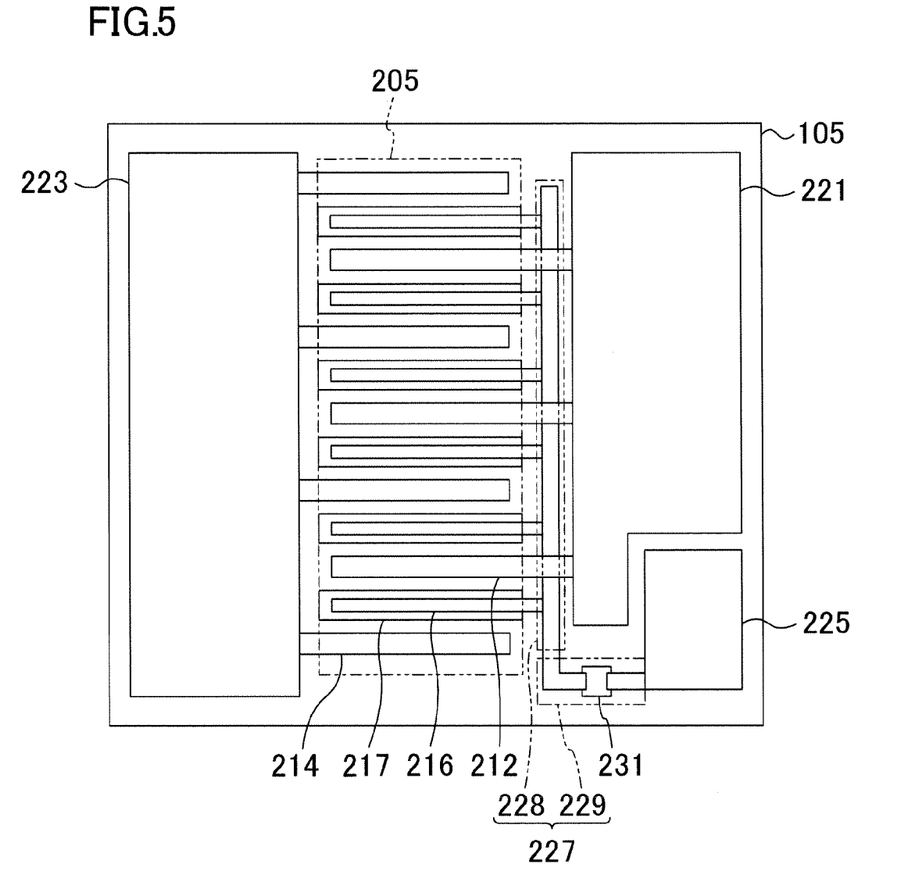
FIG. 5 is a plan view illustrating a semiconductor device of a second embodiment.

A second embodiment will be described with reference to the drawings. FIG. 5 is a plan view illustrating a semiconductor device of the second embodiment. In FIG. 5, only electrodes and pads etc. are shown, while an insulating film covering the electrodes, and plugs connecting the electrodes and the pads are not shown. In FIG. 5, the same components as those shown in FIG. 1 are indicated by the same reference characters so as not to repeat the description of such components. As shown in FIG. 5, the semiconductor device of the second embodiment is a multi-finger HFET. The multi-finger structure allows efficient layout of the HFET. This can significantly increase a gate width of the HFET, thereby providing a power device which can be operated at large current.

A semiconductor layer stack 105 is formed on the substrate with a buffer layer interposed therebetween. A first ohmic electrode as a source electrode, a second ohmic electrode as a drain electrode, and a gate electrode are formed on the semiconductor layer stack 105. The first ohmic electrode includes a plurality of first ohmic electrode fingers 212, the second ohmic electrode includes a plurality of second ohmic electrode fingers 214, and the gate electrode includes a plurality of gate electrode fingers 216. The first ohmic electrode fingers 212 and the second ohmic electrode fingers 214 are alternately arranged, and are spaced from each other. Each of the gate electrode fingers 216 is arranged between the adjacent first ohmic electrode finger 212 and second ohmic electrode finger 214 with a control layer 217 made of a p-type AlGaN layer interposed between the gate electrode finger and the semiconductor layer stack. In this structure, a plurality of units each including a source electrode, a gate electrode, and a drain electrode are arranged to be flipped relative to the drain electrode.

The first ohmic electrode fingers 212 are connected to a first pad 221. The second ohmic electrode fingers 214 are connected to a second pad 223. The gate electrode fingers 216 are connected to a gate pad 225 through a gate interconnect 227. A resistive element 231 is inserted in the gate interconnect 227.

Figure 6:
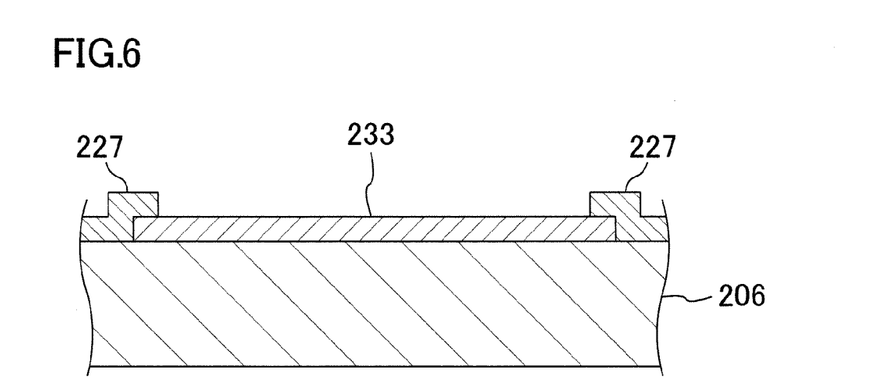
FIG. 6 is a cross-sectional view illustrating a resistive element of the semiconductor device of the second embodiment.

Impurities, such as boron (B), iron (Fe), etc., are injected in part of the semiconductor layer stack 105 to form a dielectric isolation region having higher resistance than the other region. The dielectric isolation region is formed to surround an active region 205. The active region 205 is a region where the first ohmic electrode fingers 212, the second ohmic electrode fingers 214, and the gate electrode fingers 216 are formed, i.e., a channel region, and is not dielectrically isolated. The resistive element 231 of the present embodiment is formed with a p-type AlGaN layer 233 formed on the dielectric isolation region 206 as shown in FIG. 6. The gate interconnect 227 includes a finger connector 228 which connects the gate electrode fingers 216 in parallel, and a pad connector 229 which connects the finger connector 228 and the gate pad 225. The resistive element 231 is formed by cutting part of the pad connector 229, and inserting the p-type AlGaN layer 233 in the cut part. Specifically, the resistive element 231 is inserted between the gate electrode finger 216 closest to the gate pad 225 and the gate pad 225.

With the above-described configuration, each of the gate electrode fingers 216 as the gate electrode, and the gate pad 225 are connected through the resistive element 231 formed on the substrate. Specifically, resistance can be series-connected to the gate electrode without externally connecting the resistance. This can improve the switching characteristic without increasing parts count.

In the present embodiment, the resistive element 231 is formed with the p-type AlGaN layer 233. Thus, the p-type AlGaN layer 233 can simultaneously be formed with the control layer 217. In this case, the p-type AlGaN layer 233 and the control layer 217 have approximately the same impurity concentration. This is advantageous because the semiconductor device with improved switching characteristic can be fabricated with less change to the fabrication process. The resistive element 231 may be formed with a nitride semiconductor layer having a composition different from that of the control layer 217. The resistive element 231 may be made of a material except for the nitride semiconductor. In general, the gate interconnect 227 is made of a material having high conductivity, such as Au etc. Thus, the resistive element can be formed by inserting a material having higher specific resistance than the gate interconnect 227 in the gate interconnect. Therefore, the p-type AlGaN layer 233 may be replaced with a thin, high-resistance metal layer made of a nickel chromium alloy (Nichrome) etc. In this case, the thin metal layer may be formed by vapor deposition, sputtering, etc. The thin metal layer may be thinned or elongated to increase a resistance value of the resistive element. When the thin metal layer is formed in a serpentine form, the thin metal layer can be elongated, while keeping an area occupied by the thin metal layer small.

Figure 7:
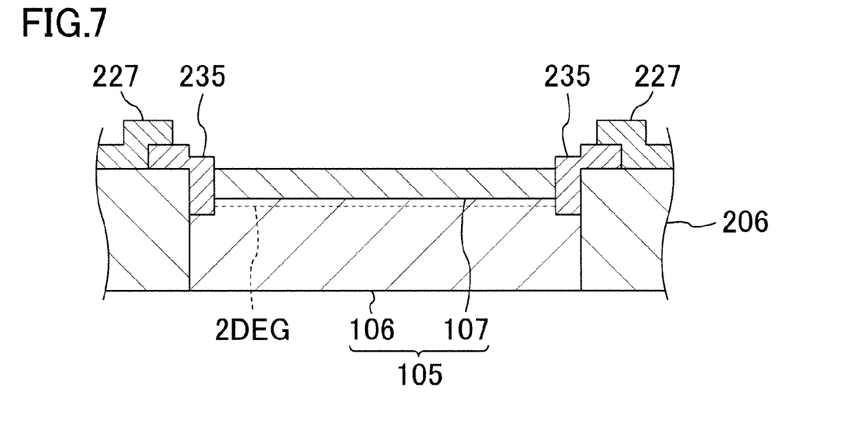
FIG. 7 is a cross-sectional view illustrating another resistive element of the semiconductor device of the second embodiment.

The resistive element may be configured as shown in FIG. 7. In this case, the resistive element is formed not on the dielectric isolation region, but on a region which is not increased in resistance except for the active region. As shown in FIG. 7, the resistive element is formed with two metal terminals 235 formed to be spaced from each other, and a 2DEG layer formed between the metal terminals 235. The metal terminals 235 may be made of any material as long as they can form ohmic contact with the 2DEG layer, and may be formed with a stack of Ti and Al, a stack of Ti, Al, and Ti, etc. When the metal terminals 235 and the ohmic electrode are made of the same material, they can be formed in the same step, and the number of the steps hardly increases. In the structure of FIG. 7, recesses are formed in the semiconductor layer stack 105 to bring the metal terminals 235 into direct contact with the 2DEG layer. However, the ohmic contact between the metal terminals and the 2DEG layer may be formed by tunnel effect without forming the recesses.

Figure 8:
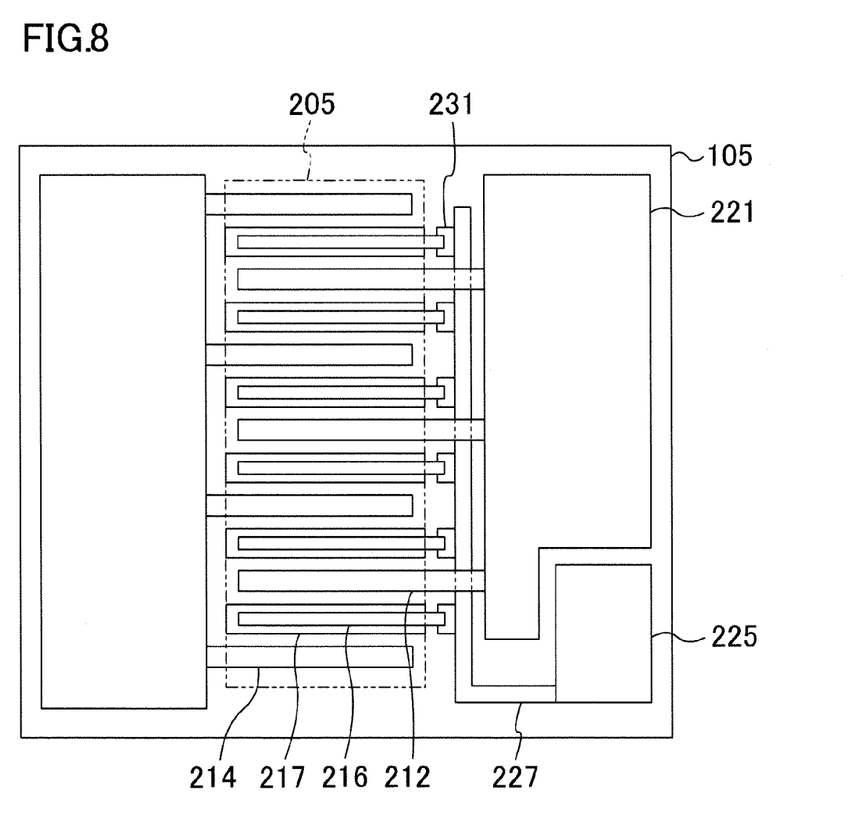
FIG. 8 is a plan view illustrating an alternative of the semiconductor device of the second embodiment.

In the present embodiment, the resistive element 231 is formed between the finger connector 228 and the gate pad 225. However, multiple resistive elements 231 may be formed to correspond to the gate electrode fingers 216, respectively. Specifically, as shown in FIG. 8, the multiple resistive elements 231 may be formed between the gate electrode fingers 216 and the gate interconnect 227. When a high resistance value is required, the multiple resistive elements 231 may be formed to correspond to the gate electrode fingers 216, respectively, and another resistive element 231 may be formed between the finger connector 228 and the gate pad 225. The control layer 217 may be configured as described in the first embodiment.

Figure 9:
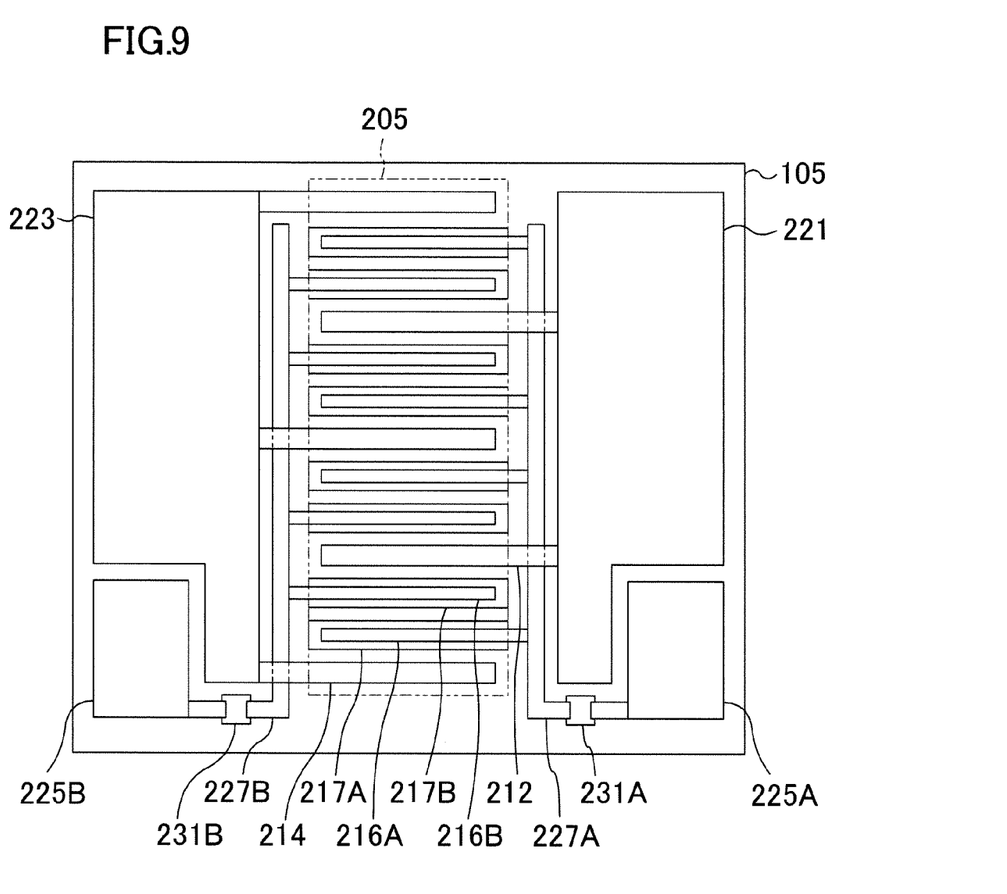
FIG. 9 is a plan view illustrating another alternative of the semiconductor device of the second embodiment.

In the present embodiment, a single gate HFET has been described. However, the same advantages can be provided when the structure of the present embodiment is applied to a double gate HFET. In this case, as shown in FIG. 9, a first gate electrode finger 216A and a second gate electrode finger 216B may be formed between the adjacent first ohmic electrode finger 212 and second ohmic electrode finger 214. A first resistive element 231A may be formed in a first gate interconnect 227A connecting the first gate electrode fingers 216A and a first gate pad 225A, and a second resistive element 231B may be formed in a second gate interconnect 227B connecting the second gate electrode fingers 216B and a second gate pad 225B. The first resistive element 231A and the second resistive element 231B may be arranged at the same positions, and may have the same structure as the resistive element in the single gate HFET. The first resistive element 231A and the second resistive element 231B preferably have the same structure because the first and second gate electrodes are balanced. However, the first resistive element 231A and the second resistive element 231B may have different structures so that the first and second gate electrodes have different structures.

Third Embodiment

Figure 10:
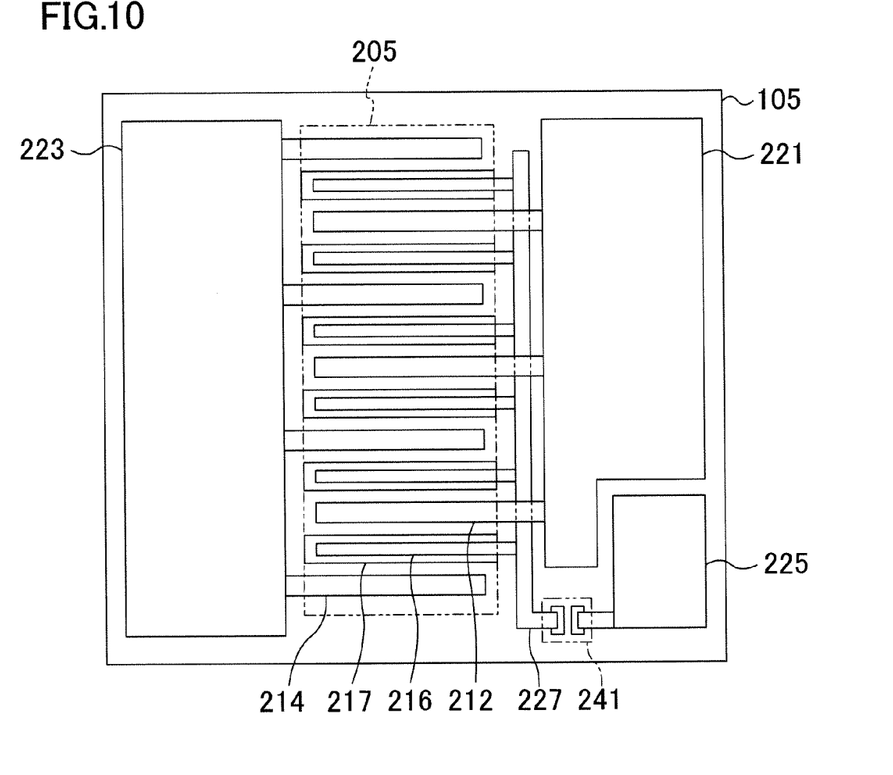
FIG. 10 is a plan view illustrating a semiconductor device of a third embodiment.

A third embodiment will be described below with reference to the drawings. FIG. 10 is a plan view illustrating a semiconductor device of the third embodiment. In FIG. 10, only electrodes and pads are shown, while an insulating film covering the electrodes, and plugs connecting the electrodes and the pads are not shown. In FIG. 10, the same components as those shown in FIG. 5 are indicated by the same reference characters so as not to repeat the description of such components.

Figure 11:
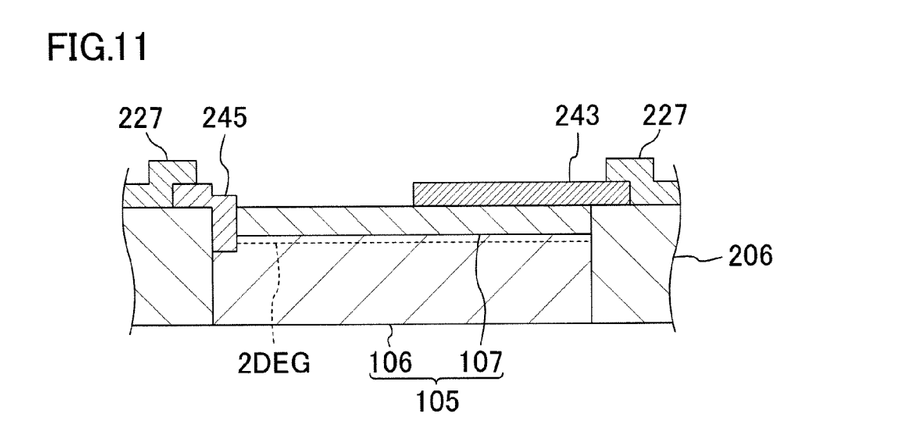
FIG. 11 is a cross-sectional view illustrating a diode of the semiconductor device of the third embodiment.

In the semiconductor device of the present embodiment, a diode 241 is formed in place of the resistive element 231. The diode 241 includes a p-type AlGaN layer 243, and a cathode electrode 245 as shown in FIG. 11. The p-type AlGaN layer 243 is formed on part of the semiconductor layer stack 105 which is not increased in resistance. Thus, a 2DEG layer is formed at a heterojunction interface below the p-type AlGaN layer, thereby providing pn junction between the p-type AlGaN layer 243 and the 2DEG layer. The cathode electrode 245 may be made of any material as long as it can form ohmic contact with the 2DEG layer, and may be formed with a stack of Ti and Al, a stack of Ti, Al, and Ti, etc. In FIG. 11, a recess is formed in the semiconductor layer stack 105 to bring the cathode electrode 245 into direct contact with the 2DEG layer. However, the ohmic contact between the cathode electrode 245 and the 2DEG layer may be formed by tunnel effect without forming the recess.

In the semiconductor device of the present embodiment, the diode 241 formed on the substrate is series-connected between the gate electrode fingers 216 as a gate electrode and the gate pad 225 are connected in series. The diode 241 has an anode closer to the gate pad 225. Thus, a resistance value between the gate pad and the gate electrode increases, and a threshold of the gate electrode increases by a forward voltage of the diode 241. Increasing the threshold reduces the occurrence of malfunction of the semiconductor device even when noise etc. is generated in a gate drive circuit.

In the present embodiment, a pn junction diode is formed with the p-type AlGaN layer 243 and the 2DEG layer. Thus, an area occupied by the pn junction diode on the substrate is small, and the size of the semiconductor device hardly changes. The p-type AlGaN layer 243 as the anode can simultaneously be formed with the control layer 117 in the same step. The cathode electrode 245 can simultaneously be formed with the first and second ohmic electrodes in the same step. Thus, they can simultaneously be formed by merely changing a mask, without increasing the number of steps.

Figure 12:
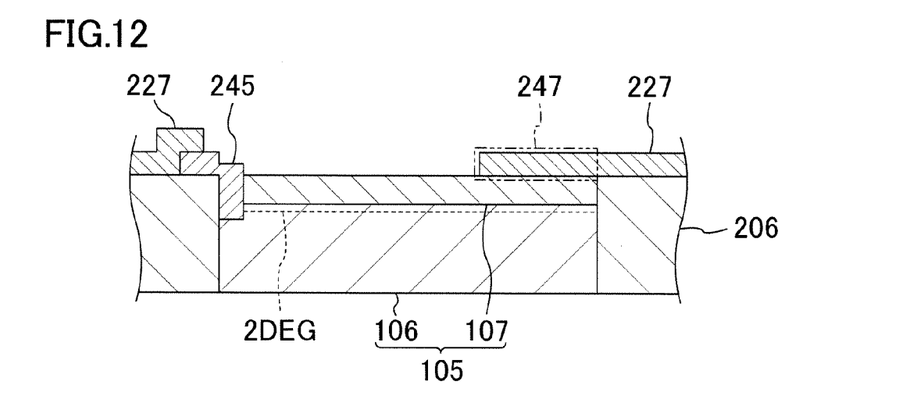
FIG. 12 is a cross-sectional view illustrating another diode of the semiconductor device of the third embodiment.

The diode is not limited to the pn junction diode. For example, a Schottky diode using part of the gate interconnect 227 as a Schottky electrode 247 as shown in FIG. 12 may be used. Also in this case, the Schottky diode can be formed by merely changing the mask.

Figure 13:
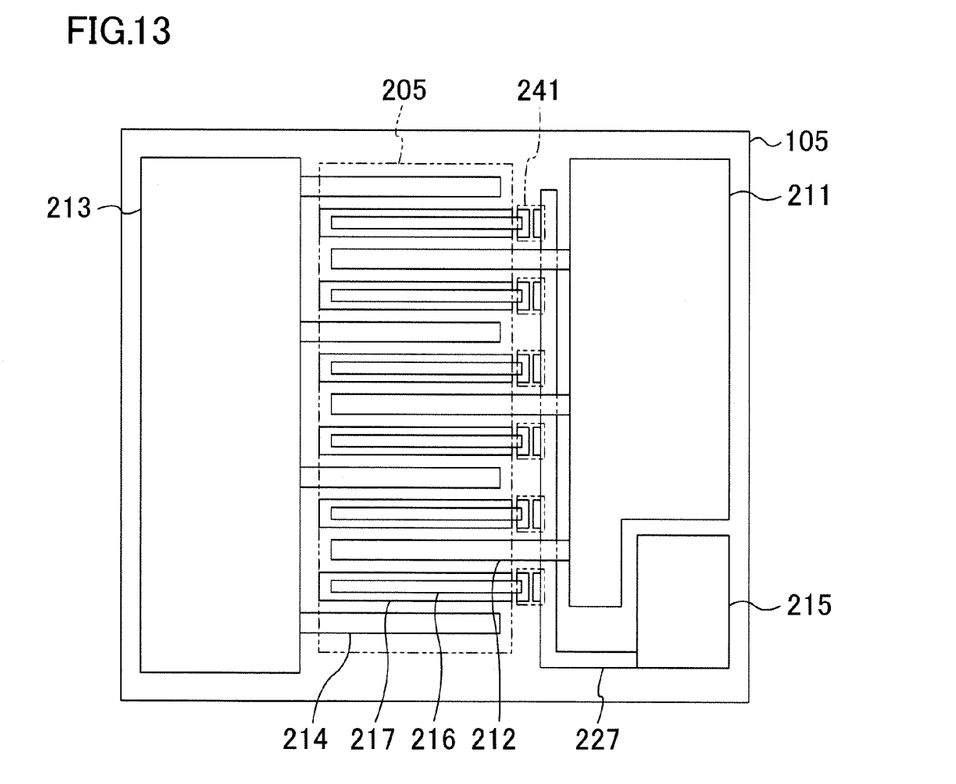
FIG. 13 is a plan view illustrating an alternative of the semiconductor device of the third embodiment.

In the present embodiment, as shown in FIG. 13, multiple diodes 241 may be formed between the gate electrode fingers 216 and the gate interconnect 227. Connecting the multiple diodes in series can increase an increment of threshold voltage. Thus, multiple diodes 241 may be formed to correspond to the gate electrode fingers 216, respectively, and another diode 241 may be formed between the gate electrode finger 216 closest to the gate pad 225 and the gate pad 225. The multiple diodes may be formed at any position.

The structure of the present embodiment can be applied to a double gate HFET. In this case, a first diode connected between a first gate electrode and a first gate pad, and a second diode connected between a second gate electrode and a second gate pad may have the same structure to make thresholds of the first and second gate electrodes uniform. When the first and second diodes have different structures, the double gate HFET can be provided with the first and second gate electrodes having different thresholds.

The structure of the present embodiment may be combined with the structure of the first embodiment. The structure of the present embodiment may be combined with the second embodiment.

In the second and third embodiments, the arrangement of the first pad, the second pad, and the gate pad may suitably be changed. The structures of the second and third embodiments may be applied to a HFET which does not include the multiple fingers, and the structure of the first embodiment may be applied to the multi-finger HFET. The compositions of the first and second nitride semiconductor layers, and the control layer may suitably be changed.

According to the present disclosure, a semiconductor device can be provided with high switching performance without increasing the number of external parts, and an area and cost of the semiconductor device. The disclosed semiconductor device is useful for power devices used in power supply circuits, etc.

What is claimed is:
1. A semiconductor device comprising:
   a substrate;
   a semiconductor layer stack including a first nitride semiconductor layer which is formed on the substrate, and a second nitride semiconductor layer which is formed on the first nitride semiconductor layer, and has larger band gap than the first nitride semiconductor layer;
   a first ohmic electrode and a second ohmic electrode which are formed on the semiconductor layer stack, and are spaced from each other;
   a first control layer formed between the first ohmic electrode and the second ohmic electrode; and
   a first gate electrode formed on the first control layer, wherein
   the first control layer is formed with a p-type nitride semiconductor layer stack, and
   the p-type nitride semiconductor layer stack includes
      a lower layer which is in contact with the second nitride semiconductor layer, an intermediate layer which is formed on the lower layer, and has lower impurity concentration than the lower layer, and an upper layer which is formed on the intermediate layer, and has higher impurity concentration than the intermediate layer.

2. The semiconductor device of claim 1, wherein the intermediate layer is thicker than the lower layer.

3. The semiconductor device of claim 2, wherein the lower layer is thicker than the upper layer.

4. The semiconductor device of claim 1, wherein the number of carriers per unit area in the lower layer is equal to or greater than the number of electrons per unit area in two-dimensional electron gas generated at an interface between the first nitride semiconductor layer and the second nitride semiconductor layer.

5. The semiconductor device of claim 1, further comprising:

a second control layer which is formed between the first control layer and the second ohmic electrode, and is formed with the p-type nitride semiconductor layer stack; and a second gate electrode formed on the second control layer.

* * * * *